United States Patent [19]

Bonner et al.

[11] 4,265,980
[45] May 5, 1981

[54] TECHNIQUE FOR THE GROWTH OF MAGNETIC GARNET COMPOSITIONS

[75] Inventors: William A. Bonner, Warren Township, Somerset County; LeGrand G. Van Uitert, Morris Township, Morris County, both of N.J.

[73] Assignee: Bell Telephone Laboratories, Incorporated, Murray Hill, N.J.

[21] Appl. No.: 866,024

[22] Filed: Dec. 30, 1977

[51] Int. Cl.$^3$ ............................................. C30B 19/04
[52] U.S. Cl. ................................. 428/697; 156/624; 156/DIG. 63; 252/364; 106/286.2; 428/693
[58] Field of Search ............... 156/622, 624, DIG. 63; 106/286.2; 252/62.3, 364; 428/539

[56] References Cited

U.S. PATENT DOCUMENTS 3,790,405   2/1974   Levinstein ............................ 156/624

FOREIGN PATENT DOCUMENTS 683382   3/1964   Canada ..................................... 156/624
50-84471 7/1975  Japan ................................ 156/DIG. 63

OTHER PUBLICATIONS

I Crystals – Rooijmans (Ed) Springer–Verlag, N.Y. 1978, pp. 79, 94 (particularly footnote 56).
Translation of Izvestiya Akademii, Neorganicheskie Materialy V 11, No. 1, pp. 108–111, 1/75.

*Primary Examiner*—Hiram Bernstein
*Attorney, Agent, or Firm*—Edward M. Fink; Bruce S. Schneider

[57] ABSTRACT

Magnetic garnet compositions grown from a novel flux comprising a mixture of $Li_2MoO_4$ and $R_2(MoO_4)_3$ wherein R represents yttrium or a rare earth element having an atomic number from 62 to 71 have appropriate magnetic properties for use in bubble domain devices. Items produced are uniform in composition and may be of submicron thickness.

13 Claims, No Drawings

TECHNIQUE FOR THE GROWTH OF MAGNETIC GARNET COMPOSITIONS

This invention relates to a technique for the growth of magnetic garnet films suitable for use in magnetic devices, such as bubble devices. More particularly, the present invention relates to a technique for the growth of magnetic garnet films by liquid phase epitaxy from a flux comprising lithium and rare earth molybdates.

In recent years, there has been a birth of interest in a class of magnetic devices commonly referred to as "bubble" domain devices. These devices are generally planar in configuration and are constructed of materials which have magnetically easy directions essentially perpendicular to the plane of the structure. Magnetic properties, such as magnetization, anisotropy, coercivity, and mobility are such that the device may be maintained magnetically saturated with magnetization in a direction out of the plane and that small localized regions of polarization aligned opposite to general polarization direction may be supported. These localized regions are generally cylindrical in configuration and represent memory bits which serve as the focal point of interest in such structures.

Until recently, one of the more significant obstacles to commercial realization of such devices was the limitation imposed by materials. Thus, studies revealed that significant practical difficulties obtained in the growth of large defect-free crystals which evidenced desirable physical and chemical properties. The first breakthrough in the materials area was reported in the early 70's when it was discovered that magnetic garnets of the nominal composition $Me_3Fe_5O_{12}$ wherein Me is yttrium or a rare earth metal, when properly substituted and evidenced a growth induced magnetic easy direction and were possessed of magnetic properties suitable for bubble devices. Although devices utilizing thin slices of such material were in operation, soon thereafter a more direct approach to the preparation of thin layers of magnetic material was being pursued.

Of the several procedures contemplated for effecting this end, the most attractive has been liquid phase epitaxy (LPE). This procedure may utilize growth from flux compositions closely related to those already in use in the growth of bulk materials. Heretofore, flux compositions chosen for this purpose have been comprised of lead oxide, lead fluoride and boron oxide or, alternatively, from a mixture of the oxides of barium and boron. Although each of these flux systems has proven satisfactory for the growth of garnet meeting device requirements, inherent limitations have motivated workers in the art to further their investigatory efforts. Thus, for example, preservation of crystal purity is a matter of concern since $Pb^{++}$ and $Ba^{++}$ ions can be incorporated in the garnet lattice. Additionally, lead oxide based fluxes tend to react with platinum crucibles and are volatile in nature. Although the barium oxide based fluxes do not suffer from these deficiencies, they tend to be viscous in nature. Consequently, a search for alternative flux compositions was undertaken.

In accordance with the present invention, magnetic garnet films appropriate for use in magnetic devices, such as bubble devices, are grown by liquid phase epitaxy from a flux composition comprising lithium molybdate and rare earth molybdates. This system has been found to evidence essentially zero volatility, low viscosity and low density with respect to garnet. Accordingly, the molybdate flux is well suited for liquid phase epitaxial growth of garnet upon seeds or substrates.

Garnets suitable for the practice of the instant invention are of the nominal formulation $$Me_3M_5O_{12}$$

wherein O is oxygen, M is a trivalent metal selected from among trivalent iron, gallium, aluminum or mixtures thereof and Me is yttrium or a rare earth element ranging in atomic number from 62 to 71.

Epitaxial films prepared in accordance with the invention are grown on (111) or (100) plates of garnet materials having lattice parameters nearly matching those of the film at room temperature. It has been found adequate to match lattices within about 0.5 percent ($a_o$, generally is of the order of 12 Angstroms). This end is most easily attained by use of garnet substrates, $Gd_3Ga_5O_{12}$ being particularly well suited for this purpose. Additionally, the substrate should evidence a high degree of crystalline perfection, that is, essentially free of low angle grain boundaries, and it should be smooth and flat.

The processing conditions selected for practice of the present invention are selected to give rise to the (111) or (100) facet of grown epitaxial material, such being considered essential to the invention. In the preferred technique for growth by LPE herein, growth proceeds on an immersed substrate. This end is accomplished by selecting an appropriate seed crystal or substrate member of the type alluded to above and immersing the substrate in a suitable melt which is maintained at an elevated temperature. In this procedure, growth is effected by transport without changing temperature during the growth period at a rate typically ranging from 0.05 μm/hr. to 0.25 μm/minute.

As noted, the flux employed herein is composed of lithium molybdate and a rare earth molybdate, the flux being essentially non-volatile and less dense than garnet, so permitting isothermal growth of films of uniform composition by transfer through a gradient from a source of nutrient that is originally precipitated at the bottom of a crucible due to the low solubility of the crystal components in the flux and the lower density of the latter.

In order to insure stoichiometric transfer of garnet, the rare earth elements in the flux are chosen to correspond with and are in the same ratio as the garnet nutrient.

In the operation of the process, the component garnet oxides are mixed with the lithium molybdate and rare earth molybdates and heated to the melting point of the mixture, typically from 800°–1100° C. Temperatures in excess of 1100° C. result in volatilization of molybdates whereas temperatures less than 800° C. result in solid fluxes. The flux comprises a mixture of lithium molybdate ($Li_2MoO_4$) and a rare earth or yttrium molybdate $R_2(MoO_4)_3$, the mixture containing from 20–50 mole percent of rare earth or yttrium molybdate. The flux composition may contain from −50 to +25 mole percent molybdenum oxide ($MoO_3$) with respect to stoichiometry. Excesses beyond 25 mole percent tend to result in the precipitation of molybdates, particularly iron molybdate. Compositions containing deficiencies of greater than 50 mole percent molybdenum oxide yield an unidentified lithium rare earth iron molybdate. In general, garnet may be precipitated from melts containing rare earth oxide in excess of that required for rare earth molybdate stoichiometry by the addition of $Fe_2O_3$, $Ga_2O_3$ and $Al_2O_3$ alone or in combination.

After attaining an equilibrium between the mixture of precipitated garnet and the melt, the substrate member which has been preheated to the melt temperature is inserted in the melt, immersed therein and rotated at a speed ranging from 50-200 rpm for a time period ranging from 1-24 hours, the period of immersion being dependent upon the thickness of the film desired. Due to the limited solubility (less than 1.0 mole percent) of garnet in the flux composition, garnet particles precipitate and settle to the bottom of the crucible employed and, subsequently, become the source of solute for film growth by transfer through the flux and on to a seed or substrate. The precipitated garnet of course has the same ratio of component oxides as the overall melt.

Following growth of an epitaxial film of the desired thickness, the substrate member is removed from the melt and spun at a rate ranging from 200-500 rpm for the purpose of spinning off flux. Then the substrate is cooled to room temperature over a time period ranging from 15 to 30 minutes during removal from the furnace.

Examples of the practice of the present invention are set forth below. These samples are merely by way of exposition and not to be construed as limiting.

Yttrium iron garnet, yttrium aluminum garnet and yttrium europium iron gallium garnet of the nominal compositions, $Y_3Fe_5O_{12}$, $(YEu)_3(FeGa)_5O_{12}$, respectively, were grown from a flux composition and component composition as shown in Table I, below.

TABLE I

|  |  | Garnet Crystallized | | | |
| --- | --- | --- | --- | --- | --- |
|  |  | $Y_3Fe_5O_{12}$ | | $(YEu)_3(FeGa)_5O_{12}$ | |
| Melt Components | | wgt (g) | moles | wgt (g) | moles |
| $Y_2O_3$ | | 22.6 | 0.10 | 18.06 | 0.08 |
| $Eu_2O_3$ | Flux |  |  | 7.04 | 0.02 |
| $MoO_3$ |  | 43.2 | 0.30 | 43.2 | 0.30 |
| $Li_2MoO_4$ |  | 50.0 | 0.288 | 75.0 | 0.432 |
| $Y_2O_3$ |  | 6.8 | 0.03 | 5.42 | 0.024 |
| $Eu_2O_3$ |  |  |  | 2.11 | 0.006 |
| $Fe_2O_3$ | Crystal | 8.0 | 0.05 | 6.39 | 0.04 |
| $Ga_2O_3$ |  |  |  | 1.87 | 0.01 |

The furnace employed contained a vertical three-inch inner diameter, platinum-20% rhodium wire wound muffle, approximately 10 inches long. A standard 100 cc platinum crucible was used to contain approximately 300 grams of melt and was positioned on an aluminum pedestal such that a vertical temperature gradient of 10°-60° C. could be maintained at the growth temperature. The components of the melt were heated to a temperature of approximately 1000° C. to complete melting and allowed to equilibrate for 24 hours. Epitaxial films were then deposited upon polished gadolinium gallium garnet substrates held horizontally in a platinum tricep. Prior to initiating growth, the substrates were positioned just above the melt surface for a period of time sufficient to achieve the melt temperature. The substrates were then immersed below the surface of the melt and rotated at a speed of 100-200 rpm for a time period of approximately 6 hours, so resulting in a film thickness ranging from 6-8 μm. Grown films were next raised above the melt surface and rotated at 500 rpm to drain off adhering flux droplets.

Studies of the grown films revealed that the growth rate ranged from 0.05 μm/hr.–0.25 μm/min., slow rotation and a steep gradient providing the fastest transport of nutrient.

A comparison of the properties of films grown from lithium, rare earth molybdate fluxes and from lead oxide and barium oxide based solutes is shown in Table II, below. As noted, the flux described herein has definite advantages over both known solvents for controlled growth on seeds and for their film deposition. Because of the low density and low viscosity, there is little tendency for particulate matter to be carried from the garnet deposit at the bottom of the crucible to interfere with the growing film or crystal. The velocity of the molybdate flux is essentially negligible at 1200° C. Accordingly, unpredictable changes in melt composition and unwanted spontaneous nucleation of the melt surface are avoided. Additionally, the molybdate flux is not reactive with platinum crucibles and is non-toxic. Most notable, however, is the fact that neither $Li^+$ nor $Mo^{6+}$ ions are incorporated as impurities in the garnet lattice to the extent of $Pb^{++}$ and $Ba^{++}$ levels.

TABLE II

| | Comparison of Properties of Solvents Used for Garnet Growth | | |
| --- | --- | --- | --- |
| | BaO based | PbO based | LRM |
| Melting Point | 750–915° C. | < 700° C. (Growth temp. ~ 900–1000° C.) | 800–1100° C. |
| Volatility | Negligible at 1450° C. | Considerable at 900° C. | Negligible at 1200° C. |
| Viscosity | Relatively high at temperatures less than 1050° C., increases with time at temperatures less than 850° C., > 100 cp | Low down to 800° C., 10–100 cp | Low for all compositions |
| Chemical Reactivity with Platinum | Negligible | Reacts readily if free lead is present | None |
| Density | Less than magnetic bubble materials (~ 4.7 gm/cm³) | Greater than magnetic bubble materials (~ 6 gm/cm³) | Much less than magnetic and optical garnets ~ 3.5 g/cm³ |
| Solubility of Magnetic Garnets | ~ 18 mole % at 1000° C., 2–3 times greater than $PbO$—$B_2O_3$ | ~ 7.3 mole % at 940° C. | < 1.0 mole % |
| Phase Stability | Garnets and ortho-ferrites are congruently saturating | Garnets are not congruently saturating | Garnets are congruently saturating |
| Solvent Incor- | < 0.1 wt. % Ba at | 1–3 wt. % Pb at 900° C. | No solvent related |

TABLE II-continued

| Comparison of Properties of Solvents Used for Garnet Growth | | | |
|---|---|---|---|
| | BaO based | PbO based | LRM |
| poration (decreases with increasing temperatures) | typical crystal growth temperatures | growth temperature | impurities detected |
| Temperature Variation of Distribution Coefficients | $\alpha_{Ga} \approx 1$, temperature insensitive | $\alpha_{Ga} = 1.6\text{-}2.5$ very, very temperature sensitive | $\alpha_{Ga} \approx 1$, slight temperature sensitivity $\alpha_{Fe} \approx 1$ $\alpha_{rare\ earth} \approx 1$ |
| Toxicity | Slight unless ingested | Fumes of PbO are very toxic | Nontoxic |

The static magnetic properties at 293° K. and Curie temperature of two yttrium europium iron gallium garnet films grown from lithium-rare earth molybdate fluxes in accordance with the invention is shown in Table III. The bubble properties compare favorably with similar films grown from lead oxide-boron oxide fluxes. An estimate of bubble velocity based upon comparison of bubble properties with films of known mobility is greater than 1500 cm/sec.

TABLE III

| Static Magnetic Properties of Typical Bubble Films Grown from LRM | | | |
|---|---|---|---|
| | $T_c$ (°K.) | $4\pi M_s$ (G) | $\mu$ml | $\sigma_w$ ergs/cm$^2$ |
| $Y_{2.4}Sm_{0.6}Fe_{4.0}Ga_{1.0}O_{12}$ | 431 | 367 | .17 | .18 |
| $Y_{2.3}Eu_{0.7}Fe_{3.8}Ga_{1.2}O_{12}$ | 418 | 246 | .16 | .08 |

Accordingly, it may be concluded that the described flux is uniquely suited for the preparation of high quality submicron bubble domain films.

What is claimed is:

1. Method for the epitaxial growth of a first composition of the garnet structure upon a surface of a second composition of the garnet structure by crystallization from a growth solution comprising a nutrient and a flux, the first and second compositions having lattice parameters, $a_o$, differing by a maximum of about 0.5 percent, which comprises the steps of
    (a) immersing a substrate of said second composition of the garnet structure in said growth solution containing lithium molybdate, $Li_2MoO_4$, and a molybdate of the formula $R_2(MoO_4)_3$ wherein R represents yttrium, a rare earth element ranging in atomic number from 62 to 71 or mixtures thereof, and
    (b) removing the substrate from the melt and permitting it to cool to room temperature.

2. Method in accordance with claim 1 wherein the flux comprises from 20 to 50 mole percent of $R_2(MoO_4)_3$, remainder lithium molybdate.

3. Method in accordance with claim 1 wherein said first composition of the garnet structure is of the formula $Me_3M_5O_{12}$ wherein O is oxygen, M is a trivalent metal selected from the group consisting of trivalent iron, gallium, aluminum and mixtures thereof and Me is yttrium, a rare earth element ranging in atomic number from 62 to 71 or mixtures thereof.

4. Method of claim 1 wherein the crystallographic surface of the said second composition is of (111) orientation.

5. Method of claim 1 wherein the crystallographic surface of the said second composition is of (100) orientation.

6. Method in accordance with claim 1 wherein growth of said first composition proceeds from said growth solution at a temperature within the range of 800°–1100° C.

7. Method in accordance with claim 1 wherein growth is effected over a time period ranging from 1–24 hours at a rate within the range of 0.05 $\mu$m/min.–0.25 $\mu$m/min.

8. Method in accordance with claim 1 wherein said flux comprises a mixture of yttrium molybdate and lithium molybdate.

9. Method in accordance with claim 1 wherein said flux comprises yttrium molybdate, a rare earth molybdate or mixtures thereof and lithium molybdate.

10. Method in accordance with claim 8 wherein said nutrient comprises yttrium oxide and iron oxide and said first composition is yttrium iron garnet.

11. Method in accordance with claim 8 wherein said nutrient comprises yttrium oxide, a rare earth oxide or mixtures thereof, iron oxide and gallium oxide and said first composition is yttrium rare earth gallium iron garnet.

12. Product produced in accordance with the method of claim 1.

13. Flux composition for the growth of synthetic garnet comprising a mixture of lithium molybdate, $Li_2MoO_4$ and a molybdate of the formula $R_2(MoO_4)_3$ wherein R represents yttrium or a rare earth element ranging in atomic number from 20–50 mole percent of $R_2(MoO_4)_3$, remainder lithium molybdate.

* * * * *

UNITED STATES PATENT AND TRADEMARK OFFICE
CERTIFICATE OF CORRECTION

PATENT NO. : 4,265,980
DATED : May 5, 1981
INVENTOR(S) : William A. Bonner and LeGrand G. Van Uitert It is certified that error appears in the above—identified patent and that said Letters Patent is hereby corrected as shown below:

Column 4, line 39, "of" should read --at--. Column 5, (Table III), line 30, "µml" should read --µm--.

Signed and Sealed this

First Day of June 1982

[SEAL]

Attest:

GERALD J. MOSSINGHOFF

Attesting Officer     Commissioner of Patents and Trademarks